(12) United States Patent
Tong

(10) Patent No.: US 10,978,372 B1
(45) Date of Patent: Apr. 13, 2021

(54) HEAT SINK LOAD BALANCING APPARATUS

(71) Applicant: Google LLC, Mountain View, CA (US)

(72) Inventor: Ryan C. Tong, Hercules, CA (US)

(73) Assignee: Google LLC, Mountain View, CA (US)

( * ) Notice: Subject to any disclaimer, the term of this patent is extended or adjusted under 35 U.S.C. 154(b) by 2 days.

(21) Appl. No.: 16/680,023

(22) Filed: Nov. 11, 2019

(51) Int. Cl.
| | |
|---|---|
| *G06F 1/20* | (2006.01) |
| *H01L 23/40* | (2006.01) |
| *H05K 7/20* | (2006.01) |
| *H05K 1/02* | (2006.01) |

(52) U.S. Cl.
CPC .......... *H01L 23/4093* (2013.01); *G06F 1/203* (2013.01); *H05K 1/0204* (2013.01); *H05K 7/20418* (2013.01); *G06F 1/20* (2013.01); *H01L 2924/0002* (2013.01)

(58) Field of Classification Search
CPC ....... G06F 1/20; G06F 1/203; H01L 23/4093; H05K 1/0204; H05K 7/20418
See application file for complete search history.

(56) References Cited

U.S. PATENT DOCUMENTS

| | | | |
|---|---|---|---|
| 5,343,362 A | 8/1994 | Solberg | |
| 5,640,305 A | 6/1997 | Smithers | |
| 5,917,701 A | 6/1999 | Solberg | |
| 6,557,625 B1 * | 5/2003 | Ma | H01L 23/4093 165/80.2 |
| 6,660,563 B1 | 12/2003 | Cromwell et al. | |
| 6,707,676 B1 | 3/2004 | Geva et al. | |
| 7,230,831 B2 | 6/2007 | Luckner et al. | |
| 7,321,493 B2 | 1/2008 | Liang et al. | |
| 7,474,532 B1 * | 1/2009 | Desrosiers | H01L 23/4006 165/185 |
| 9,265,157 B2 | 2/2016 | Colbert et al. | |
| 2001/0028552 A1 * | 10/2001 | Letourneau | H01L 23/4093 361/704 |
| 2003/0024688 A1 * | 2/2003 | Dowdy | H01L 23/467 165/80.3 |
| 2003/0062195 A1 | 4/2003 | Arrigotti et al. | |
| 2003/0063247 A1 | 4/2003 | Kalyandurg | |
| 2004/0011507 A1 | 1/2004 | Mok | |

(Continued)

FOREIGN PATENT DOCUMENTS

| | | |
|---|---|---|
| CN | 108419360 | 8/2018 |
| JP | 2010050409 | 3/2010 |
| WO | WO2011158756 | 12/2011 |

*Primary Examiner* — Jacob R Crum
(74) *Attorney, Agent, or Firm* — Fish & Richardson P.C.

(57) ABSTRACT

A heat sink apparatus that utilizes a pivot couple and support with anchor-spring mounts to enable exertion of a uniform amount of force over the mounting surface of the apparatus that is thermally/physically coupled to a heat load. The apparatus can include a heat sink base that has a bottom side defining the mounting surface, and a top side to which a support is pivotally coupled by a pivot couple. The apparatus can include a first and second anchor that each have a first end connected to an anchor point and a second end coupled to a load surface on the support by a spring. The load surfaces can be symmetrically disposed on opposite sides of the pivot couple, which is centrally located relative to the mounting surface so that the force imparted by spring loads of the springs is evenly distributed over the mounting surface.

22 Claims, 6 Drawing Sheets

(56) References Cited

U.S. PATENT DOCUMENTS

| | | |
|---|---|---|
| 2008/0042264 A1 | 2/2008 | Colgan et al. |
| 2009/0168360 A1* | 7/2009 | Negrut ................ H01L 23/4006 361/710 |
| 2011/0110031 A1 | 5/2011 | Homer et al. |
| 2013/0094149 A1* | 4/2013 | Kataoka .............. H01L 23/4093 361/709 |

* cited by examiner

HEAT SINK LOAD BALANCING APPARATUS

BACKGROUND

A heat dissipating apparatus is generally mounted on a heat load, such that a portion of the surface of the heat dissipating apparatus is mounted on, and thus in thermal and mechanical contact with, the heat load. The portion of the surface of the heat dissipating apparatus that is mounted on the heat load is referred to in this specification as the mounting surface.

To achieve good thermal and/or mechanical contact between the heat dissipating apparatus and the heat load, some implementations utilize anchor-spring mounts. Each anchor of an anchor-spring mount has two ends: a first end that connects to an anchor point, which is typically the surface where the anchor connects to, e.g., a printed circuit board, and a second end that is coupled to the heat dissipating apparatus. The forces exerted by the springs on the heat dissipating apparatus allows the mounting surface of the heat dissipating apparatus to maintain a desired contact pressure over the heat load.

SUMMARY

This specification relates to an apparatus that enables a heat dissipating apparatus (e.g., a heat sink, a cold plate, etc.), which can be mounted on a heat load (e.g., a hot component of an electronic assembly), to exert even (or uniform) force over the heat load.

In general, one innovative aspect of the subject matter described in this specification can be embodied in systems that include a heat sink base that can be thermally coupled to a heat load, the heat sink base defining a top side and a bottom side, wherein the bottom side defines a mounting surface that can be physically coupled to the heat load; a support that is pivotally coupled by a pivot couple to the top surface of the heat sink base; at least a first anchor and a second anchor, wherein: the first anchor has a first end and a second end, wherein the first end connects to a first anchor point, and the second end is coupled to a first load surface of the support by a first spring; the second anchor has a first end and a second end, wherein the first end connects to a second anchor point, and the second end is coupled to a second load surface of the support by a second spring; and the first load surface and the second load surface are symmetrically disposed on opposite sides of the pivot couple; wherein the pivot couple is centrally located relative to the mounting surface of the heat sink base so that a force imparted by spring loads of the first and second springs is normally transferred to the mounting surface for even distribution over the mounting surface.

These and other embodiments can each optionally include one or more of the following features.

In some implementations, the pivot couple can include a joint coupled to the top surface of the heat sink, wherein the joint can be centrally located relative to the mounting surface; and the support can be coupled to the joint, wherein the support is configured to pivot about the joint.

In some implementations, the support can be integrated with the joint, the first spring, and the second spring.

In some implementations, the system can include a load plate coupled to the top surface of the heat sink base; wherein the pivot couple can be a rod that is coupled to the load plate at a position that is central relative to the mounting surface, wherein: the rod is perpendicular to the load plate; the rod includes an opening that receives a joint into which the support is inserted, wherein the support is configured to pivot along an axis that is perpendicular to the rod and that is parallel to the mounting surface.

In some implementations, a load plate coupled to the top surface of the heat sink base can include a pressure sensor coupled to the top surface of the heat sink base; the load plate coupled to the pressure sensor, wherein the pressure sensor measures force exerted by the load plate on the top surface of the heat sink base.

In some implementations, the support can be integrated with the first spring and the second spring.

In some implementations, a rod that is coupled to the load plate at a position that is central to the mounting surface can include: a swivel coupled to the load plate at a position that is central to the mounting surface; and the rod coupled to the swivel, wherein the rod can rotate independently of the load plate about the swivel.

In some implementations, each of the first anchor and the second anchor can pass through a respective opening in the support and the heat sink.

Particular embodiments of the subject matter described in this specification can be implemented to realize one or more of the following advantages. For example, the innovations described in this specification enable a heat dissipating apparatus that utilizes anchor-spring mounts to exert an even (or uniform) force distribution over the mounting surface in comparison to conventional heat dissipating apparatuses that utilize an anchor-spring mounting approach. Spring properties (e.g., the spring constant) can vary across multiple iterations of the same spring because of variations in, e.g., material composition, manufacturing, batch, and tolerances. Such variation can lead to differences in spring loads between identical anchor-spring mounts in conventional heat dissipating apparatuses that utilize such anchor-spring mounts. Spring loads can also vary due to differences in the anchors' heights caused by differences in the anchors' relative displacement into, e.g., a printed circuit board, into which each anchor is secured. Such variation in spring loads in turn leads to an uneven (or non-uniform) force distribution over the entire mounting surface in conventional heat dissipating apparatuses. In contrast, and as further described in this specification, the innovations described in this specification enable even (or uniform) force distribution over the entire mounting surface by using a support and pivot couple (as further described in this specification) in conjunction with the anchor-spring mounts, that together compensate for the uneven force distribution caused by, e.g., the varying spring loads and/or the different relative displacement of the anchors.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The following description describes the structure and operation of a heat sink apparatus that utilizes a pivot couple and support in conjunction with anchor-spring mounts to enable the heat sink apparatus to exert an even (or uniform) amount of force over the entire portion of the heat sink apparatus that is thermally and/or mechanically in contact with a heat load. Although the below descriptions are with reference to a heat sink apparatus, other types of heat dissipating apparatuses can be used instead of the heat sink.

Figure 1:
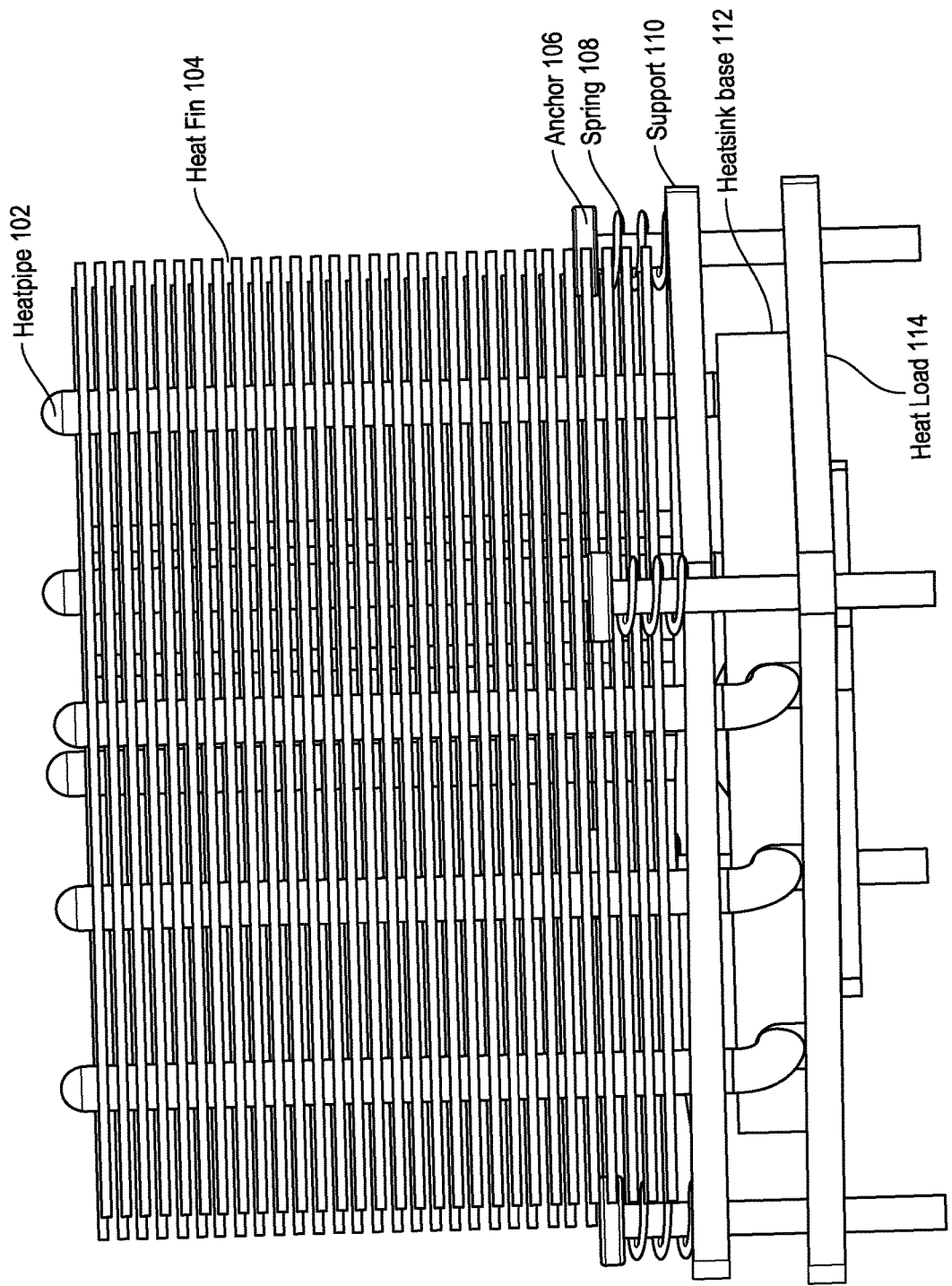
FIG. 1 is a side view of an apparatus that uses a pivot couple and a support in conjunction with anchor spring mounts to mount a heat sink to a heat load.

FIG. 1 is a side view 100 of an apparatus that uses a pivot couple and a support in conjunction with anchor spring mounts to mount a heat sink to a heat load.

The apparatus shown in FIG. 1 includes a heat sink that has multiple heat fins 102, which are connected (e.g., soldered) to heat pipes 102. Each heat pipe 102 is attached to the heat sink base 112. The heat sink base 112 is thermally and mechanically coupled to a heat load 114. The apparatus uses anchor-spring mounts to mount the heat sink base onto the heat load. The apparatus shown in FIG. 1 includes four anchor-spring mounts (only three of which are visible in FIG. 1), i.e., four anchors 106 and four springs 108. Each spring 108 that is connected to one end of a respective anchor 106, is coupled to a support 110. Although the heat sink of FIG. 1 includes four anchor-spring mounts, additional or fewer anchor-spring mounts can be used.

Details about the structure and operation of the different implementations of the pivot couple and support that are deployed in conjunction with the anchor-spring mounts is described below with reference to FIGS. 2-6.

Figure 2:
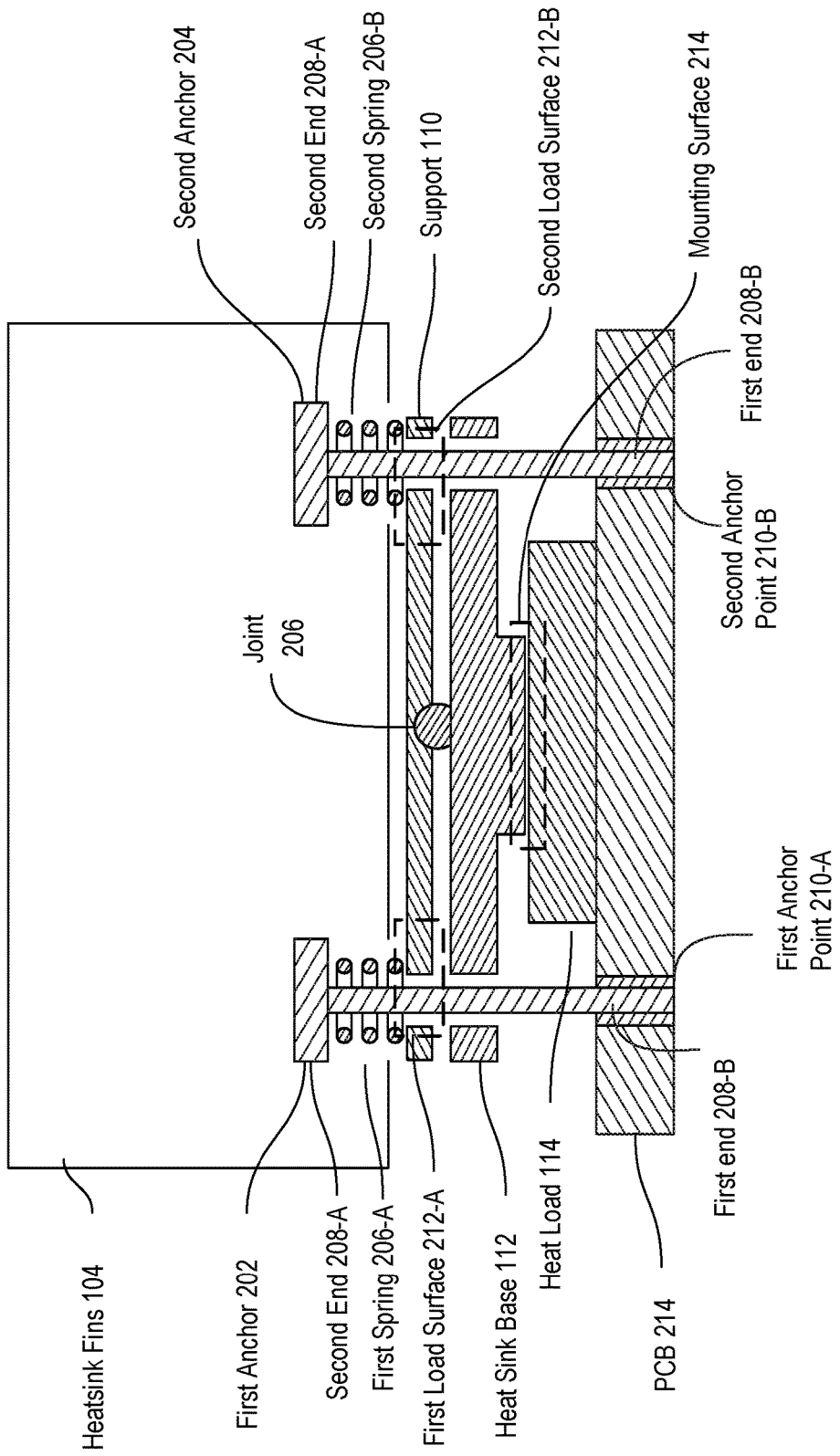
FIG. 2 is a block diagram of a first implementation of the pivot couple and support that are utilized in mounting the heat sink base onto a heat load as shown in FIG. 1.

FIG. 2 is a block diagram 200 of a first implementation of the pivot couple and support that are utilized in mounting the heat sink base onto a heat load as shown in FIG. 1.

As shown in the block diagram 200, the heat sink base 112 is mounted on, and thus is mechanically and thermally coupled to, a heat load 114. The heat sink base 112 has a top side (also referred to as surface) and a bottom side. The bottom side defines a mounting surface 214 that is physically coupled to (i.e., in contact with) the heat load 114.

A support 110 is pivotally coupled by a pivot couple to the top surface of the heat sink base 112. The pivot couple in the block diagram 200 is a joint 206, which is affixed to the top surface of the heat sink base 112 at a location that is central relative to the mounting surface 214 of the heat sink base 112.

The heat sink base 112 is mounted onto the heat load 114 using anchor-spring mounts. The block diagram 200 shows two anchor-spring mounts: (1) a first anchor 202 and a first spring 206-A and (2) a second anchor 204 and a second spring 206-B. Each of the first anchor 202 and the second anchor 204 has a first end 208-B and a second end 208-A.

The first end 208-B of each of the anchors (202 and 204) is affixed to a printed circuit board (PCB) 214 at a first anchor point 210-A and a second anchor point 210-B, respectively. As shown in FIG. 1, each of the anchors 202 and 204 pass through a respective opening in the heat sink base 112. However, in some implementations, these anchors 202 and 204 may be designed with a dent or a curve that enables these anchors to be mounted to the printed circuit board 214 without having to pass through the heat sink base 112.

A first spring 206-A is affixed to the second end 208-A of the first anchor 202, and a second spring 206-B is affixed to the second end 208-A of the second anchor 204.

The first spring 206-A rests on the support 110 at a first load surface 212-A and the second spring 206-B rests on the support 110 at a second load surface 212-B. In this manner, the second end 208-A of the first anchor 202 is coupled to the first load surface 212-A of the support 110, and the second end 208-B of the second anchor 204 is coupled to the second load surface 212-A of the support 110. As shown in block diagram 200, the first load surface 212-A and the second load surface 212-B are symmetrically disposed on opposite sides of the joint 206.

Spring loads of the first spring 206-A and the second spring 206-B impart forces onto the load surfaces of the support 110. Any unevenness in the spring forces causes the support 110 to pivot about the joint 206, but nevertheless results in the spring forces being normally transferred by the joint 206 for even distribution over the mounting surface 214. Thus, even if the resulting spring loads of the first spring 206-A and the second spring 206-B on the support 110 vary, an even (or uniform) amount of force is distributed over the mounting surface.

Figure 3:
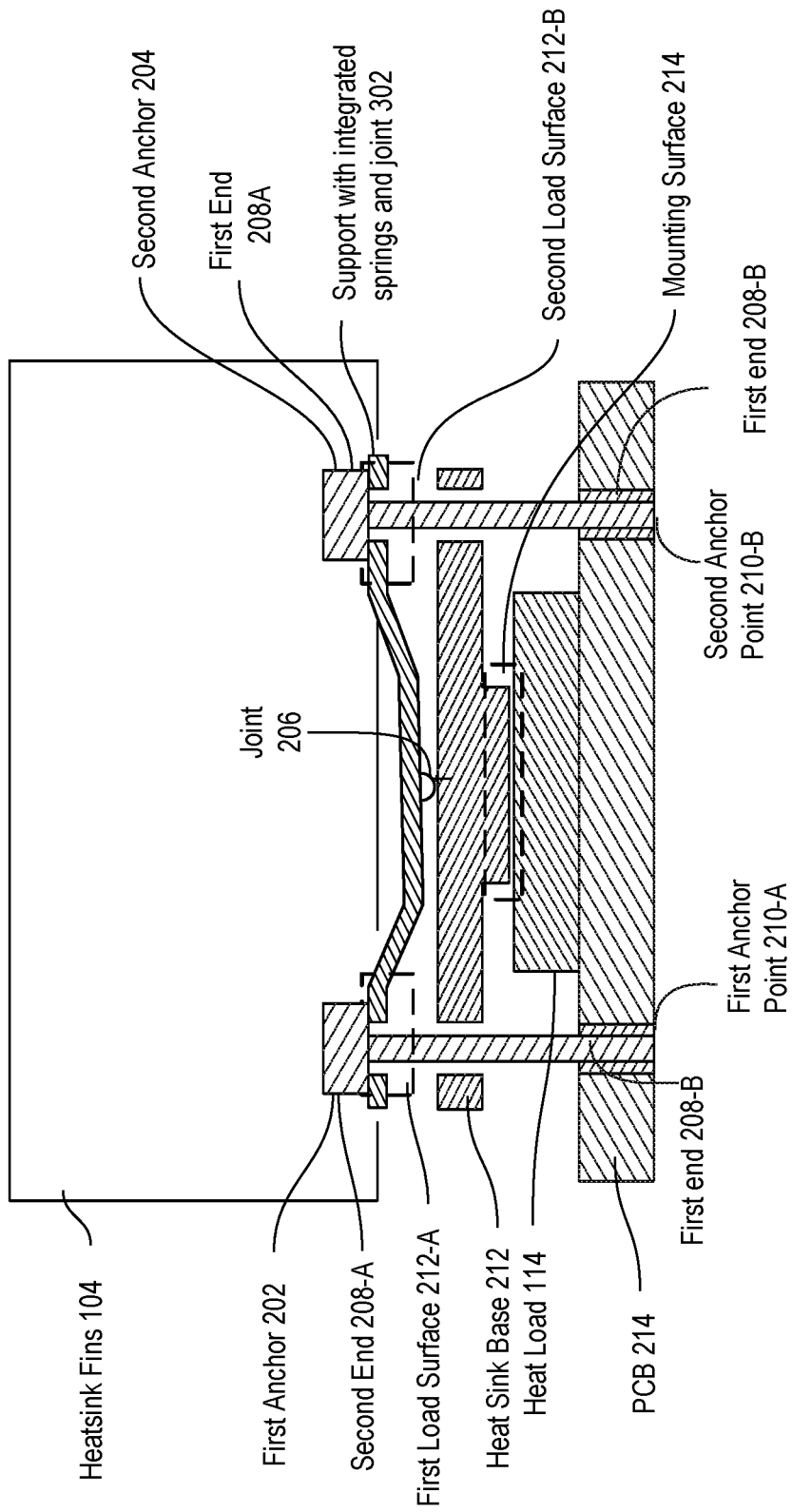
FIG. 3 is a block diagram of a second implementation of the pivot couple and support that are utilized in mounting the heat sink base onto a heat load as shown in FIG. 1.

FIG. 3 is a block diagram 300 of a second implementation of the pivot couple and support that are utilized in mounting the heat sink base onto a heat load as shown in FIG. 1.

The block diagram 300 has the same operation as the apparatus shown in FIG. 2. Even the structural aspects of the apparatus shown in block diagram 300 are the same as those shown in FIG. 2, with one exception. Unlike FIG. 2 in which the springs 206-A and 206-B, the joint 206, and the support 110 are discrete (and separate) components, these pieces are integrated into one component in FIG. 3 as a support with integrated joint and springs 312. In some implementations, the support can be integrated with the springs 206-A and 206-B, but may not be integrated with the joint 206. In such implementations, the joint 206 is a separate from the support that is integrated with the springs. Integrating the support with the joint and/or the springs can help reduce the cost of the apparatus because the resulting, integrated support could be produced using a single manufacturing process (as opposed to a separate manufacturing process for each of the multiple components, which is likely to be more expensive than the cost of producing a single component).

Figure 4:
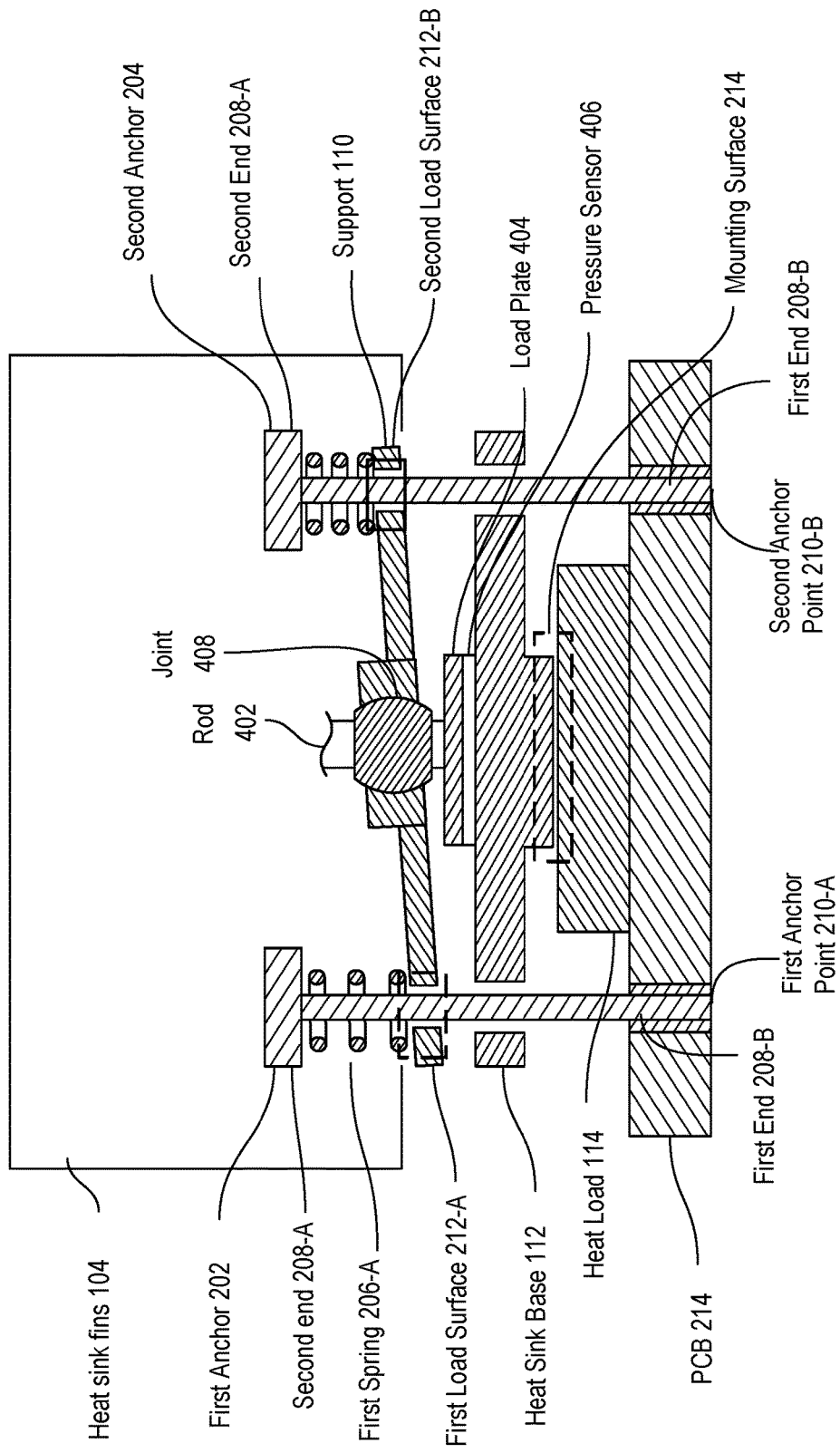
FIG. 4 is a block diagram of a third implementation of the pivot couple and support that are utilized in mounting the heat sink base onto a heat load as shown in FIG. 1.

FIG. 4 is a block diagram 400 of a third implementation of the pivot couple and support that are utilized in mounting the heat sink base onto a heat load as shown in FIG. 1.

The block diagram 400 has the same operation as the apparatus shown in FIG. 2. Even the structural aspects of the apparatus shown in block diagram 400 are generally the same as those shown in FIG. 2, with the exception that (1) the pivot couple of FIG. 4 is different from the pivot couple (i.e., a joint 206) shown and described with reference to FIG. 2 and (2) FIG. 4 also includes a load plate 404 and a pressure sensor 406. The following description provides additional details about the pivot couple of FIG. 4 as well as the load plate 404 and the pressure sensor 406.

The load plate 404 is coupled to the top surface of the heat sink base 112. As shown in FIG. 4, the load plate 404 is affixed to a pressure sensor 406, which in turn is affixed to the top surface of the heat sink base 112. The pressure sensor 406 measures, and thus enables monitoring of, the force exerted by the load plate on the top surface of the heat sink base 112. In some implementations, the pressure sensor 406 may not be used, in which case, the load plate 404 may be directly coupled to the top surface of the heat sink base 112.

The pivot couple in FIG. 4 comprises a rod 402 and joint 408. The rod 402 is coupled to the load plate 404, e.g., by screwing the rod 402 into the load plate 404. The rod 402 includes an opening that receives the joint 408. The support 110 is inserted into the joint 408 and is configured to pivot along an axis that is perpendicular to the rod 402 and that is parallel to the mounting surface 214. In implementations where a load plate 404 is not used, the rod 402 can be directly coupled to the top surface of the heat sink base 112, e.g., by screwing the rod 402 into the top surface of the heat sink base 112.

Figure 5:
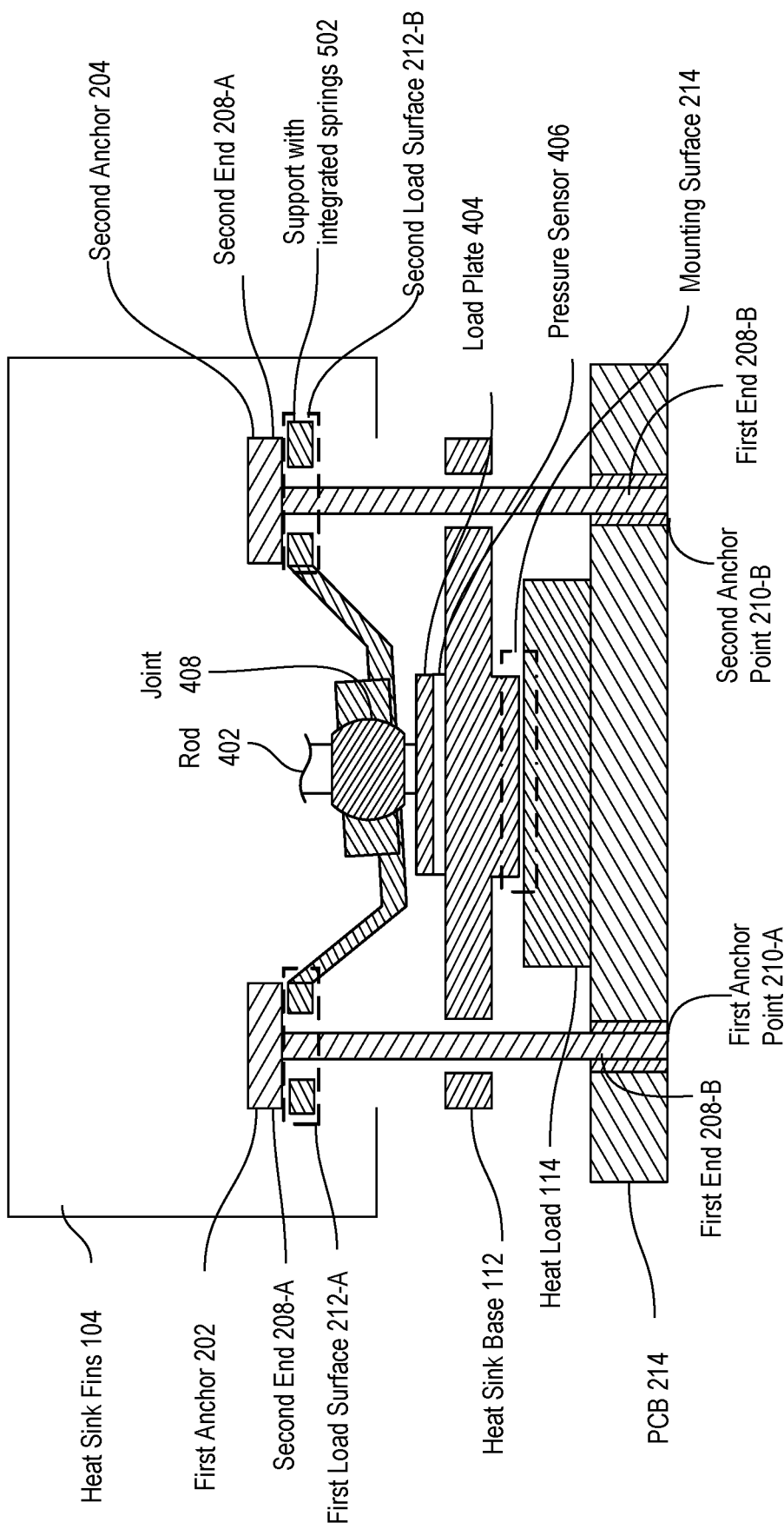
FIG. 5 is a block diagram of a fourth implementation of the pivot couple and support that are utilized in mounting the heat sink base onto a heat load as shown in FIG. 1.

FIG. 5 is a block diagram 500 of a fourth implementation of the pivot couple and support that are utilized in mounting the heat sink base onto a heat load as shown in FIG. 1.

The block diagram 500 has the same operation as the apparatus shown in FIG. 4. Even the structural aspects of the apparatus shown in FIG. 5 are the same as those shown in FIG. 4, with one exception. Unlike FIG. 4 in which the springs 206-A and 206-B, and the support 110 are discrete (and separate) components, these pieces are integrated into one component in FIG. 5, as a support with integrated springs 502.

Figure 6:
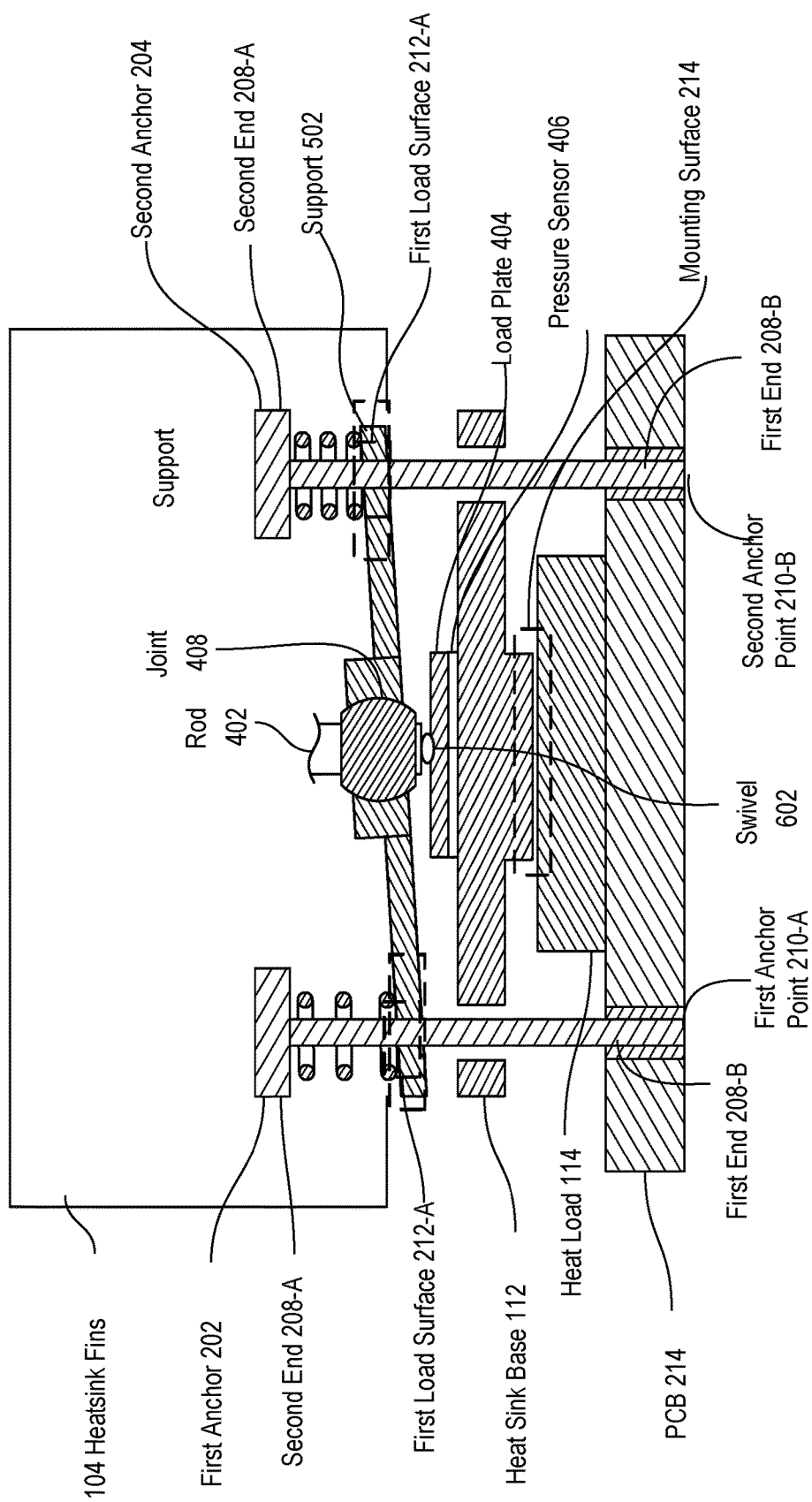
FIG. 6 is a block diagram of a fifth implementation of the pivot couple and support that are utilized in mounting the heat sink base onto a heat load as shown in FIG. 1.

FIG. 6 is a block diagram 600 of a fifth implementation of the pivot couple and support that are utilized in mounting the heat sink base onto a heat load as shown in FIG. 1.

The block diagram 600 has the same operation as the apparatus shown in FIG. 4. Even the structural aspects of the apparatus shown in block diagram 600 are the same as those shown in FIG. 4, with one exception. The block diagram 600 includes a swivel 602 that is coupled (e.g., affixed) to the load plate 404 and then the rod 402 is coupled to (e.g., screwed onto) the swivel 602. The swivel 602 enables the rod 402 to rotate about the swivel, independently of the load plate 404.

As noted with reference to FIG. 5, some implementations may not utilize a load plate 404. In such implementations, the swivel 602 is coupled to the top surface of the heat sink base 112, and the rod 402 is then coupled to the swivel 602 such that the rod 402 can rotate about the swivel, independently of the heat sink base 112.

In some implementations, the anchor-spring mounting approach described with reference to FIGS. 2-6 can be implemented using a base other than a heat sink base. In such implementations, the heat dissipating apparatus need not be a heat sink.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system comprising:
a heat sink base that can be thermally coupled to a heat load, the heat sink base defining a top side and a bottom side, wherein the bottom side defines a mounting surface that can be physically coupled to the heat load;
a support that is pivotally coupled by a pivot couple to the top side of the heat sink base;
at least a first anchor and a second anchor, wherein:
the first anchor has a first end and a second end, wherein the first end connects to a first anchor point, and the second end is coupled to a first load surface of the support by a first spring;
the second anchor has a first end and a second end, wherein the first end connects to a second anchor point, and the second end is coupled to a second load surface of the support by a second spring; and
the first load surface and the second load surface are symmetrically disposed on opposite sides of the pivot couple;
wherein the pivot couple is centrally located relative to the mounting surface of the heat sink base so that a force imparted by spring loads of the first and second springs is normally transferred to the mounting surface for even distribution over the mounting surface.

2. The system of claim 1, wherein:
the pivot couple comprises a joint coupled to the top side of the heat sink base, wherein the joint is centrally located relative to the mounting surface; and
the support is coupled to the joint, wherein the support is configured to pivot about the joint.

3. The system of claim 2, wherein the support is integrated with the joint, the first spring, and the second spring.

4. The system of claim 1, further comprising:
a load plate coupled to the top side of the heat sink base;
wherein the pivot couple is a rod that is coupled to the load plate at a position that is central relative to the mounting surface, wherein:
the rod is perpendicular to the load plate;
the rod includes an opening that receives a joint into which the support is inserted, wherein the support is configured to pivot along an axis that is perpendicular to the rod and that is parallel to the mounting surface.

5. The system of claim 4, wherein a load plate coupled to the top side of the heat sink base comprises:
a pressure sensor coupled to the top side of the heat sink base;
the load plate coupled to the pressure sensor, wherein the pressure sensor measures force exerted by the load plate on the top surface of the heat sink base.

6. The system of claim 5, wherein the support is integrated with the first spring and the second spring.

7. The system of claim 5, wherein a rod that is coupled to the load plate at a position that is central to the mounting surface further comprises:
 a swivel coupled to the load plate at a position that is central to the mounting surface; and
 the rod coupled to the swivel, wherein the rod can rotate independently of the load plate about the swivel.

8. The system of claim 1, wherein each of the first anchor and the second anchor passes through a respective opening in the support and the heat sink base.

9. The system of claim 1, wherein each of the first anchor and the second anchor passes through a respective opening in the support.

10. The system of claim 2, wherein the support is integrated with the first spring and the second spring.

11. A system comprising:
 a base that can be thermally coupled to a heat load, the base defining a top side and a bottom side, wherein the bottom side defines a mounting surface that can be physically coupled to the heat load;
 a support that is pivotally coupled by a pivot couple to the top side of the base;
 at least a first anchor and a second anchor, wherein:
  the first anchor has a first end and a second end, wherein the first end connects to a first anchor point, and the second end is coupled to a first load surface of the support by a first spring;
  the second anchor has a first end and a second end, wherein the first end connects to a second anchor point, and the second end is coupled to a second load surface of the support by a second spring; and
  the first load surface and the second load surface are symmetrically disposed on opposite sides of the pivot couple;
 wherein the pivot couple is centrally located relative to the mounting surface of the base so that a force imparted by spring loads of the first and second springs is normally transferred to the mounting surface for even distribution over the mounting surface.

12. The system of claim 11, wherein:
 the pivot couple comprises a joint coupled to the top side of the base, wherein the joint is centrally located relative to the mounting surface; and
 the support is coupled to the joint, wherein the support is configured to pivot about the joint.

13. The system of claim 12, wherein the support is integrated with the joint, the first spring, and the second spring.

14. The system of claim 11, further comprising:
 a load plate coupled to the top side of the base;
 wherein the pivot couple is a rod that is coupled to the load plate at a position that is central relative to the mounting surface, wherein:
  the rod is perpendicular to the load plate;
  the rod includes an opening that receives a joint into which the support is inserted, wherein the support is configured to pivot along an axis that is perpendicular to the rod and that is parallel to the mounting surface.

15. The system of claim 14, wherein a load plate coupled to the top side of the base comprises:
 a pressure sensor coupled to the top side of the base;
 the load plate coupled to the pressure sensor, wherein the pressure sensor measures force exerted by the load plate on the top side of the base.

16. The system of claim 15, wherein the support is integrated with the first spring and the second spring.

17. The system of claim 15, wherein a rod that is coupled to the load plate at a position that is central to the mounting surface further comprises:
 a swivel coupled to the load plate at a position that is central to the mounting surface; and
 the rod coupled to the swivel, wherein the rod can rotate independently of the load plate about the swivel.

18. The system of claim 11, wherein each of the first anchor and the second anchor passes through a respective opening in the support and the base.

19. The system of claim 11, wherein each of the first anchor and the second anchor passes through a respective opening in the support.

20. The system of claim 12, wherein the support is integrated with the first spring and the second spring.

21. A system comprising:
 a support that is configured to be pivotally coupled by a pivot couple to a heat sink base, wherein the heat sink base can be thermally coupled to a heat load and the heat sink base defines a top side and a bottom side, wherein the bottom side defines a mounting surface that can be physically coupled to the heat load;
 at least a first anchor and a second anchor, wherein:
  the first anchor has a first end and a second end, wherein the first end is configured to connect to a first anchor point, and the second end is coupled to a first load surface of the support by a first spring;
  the second anchor has a first end and a second end, wherein the first end connects to a second anchor point, and the second end is coupled to a second load surface of the support by a second spring; and
  the first load surface and the second load surface are symmetrically disposed on opposite sides of the pivot couple;
 wherein the pivot couple is configured to be centrally located relative to the mounting surface of the heat sink base so that a force imparted by spring loads of the first and second springs can be normally transferred to the mounting surface for even distribution over the mounting surface.

22. A method comprising:
 thermally coupling a heat sink base to a heat load, wherein the heat sink base defines a top side and a bottom side and wherein the bottom side defines a mounting surface that can be physically coupled to the heat load;
 pivotally coupling a support by a pivot couple to the top side of the heat sink base, wherein the pivot couple is centrally located relative to the mounting surface of the heat sink base;
 connecting a first end of a first anchor to a first anchor point;
 coupling a second end of a first anchor to a first load surface of the support by a first spring;
 connecting a first end of a second anchor to a second anchor point; and
 coupling a second end of a second anchor to a second load surface of the support by a second spring, wherein the first load surface and the second load surface are symmetrically disposed on opposite sides of the pivot couple.

* * * * *